United States Patent [19]
Cox et al.

[11] Patent Number: 5,444,719
[45] Date of Patent: Aug. 22, 1995

[54] ADJUSTABLE ERROR-CORRECTION COMPOSITE REED-SOLOMON ENCODER/SYNDROME GENERATOR

[75] Inventors: Charles E. Cox, San Jose; Gerhard P. Fettweis, Berkeley; Martin A. Hassner, Palo Alto, all of Calif.; Uwe Schwiegelshohn, Mohegan Lake, N.Y.

[73] Assignee: International Business Machines Corporation, Armonk, N.Y.

[21] Appl. No.: 8,922

[22] Filed: Jan. 26, 1993

[51] Int. Cl.$^6$ .................................. H03M 13/00
[52] U.S. Cl. ................... 371/37.1; 371/40.1; 371/41
[58] Field of Search ............. 371/37.1, 40.1, 41

[56] References Cited
U.S. PATENT DOCUMENTS

| | | | |
|---|---|---|---|
| 4,047,151 | 9/1977 | Rydbeck et al. | 340/146.1 |
| 4,413,339 | 11/1983 | Riggle et al. | 371/38 |
| 4,584,686 | 4/1986 | Fritze | 371/37 |
| 4,777,635 | 10/1988 | Glover | 371/40 |
| 4,804,959 | 2/1989 | Makansi et al. | 341/59 |
| 5,068,858 | 11/1991 | Blaum et al. | 371/41 |
| 5,130,990 | 7/1992 | Hsu et al. | 371/37.1 |
| 5,375,127 | 12/1994 | Leak | 371/40.1 |

FOREIGN PATENT DOCUMENTS
151397 10/1914 Germany .

OTHER PUBLICATIONS
US Serial No. 07/644,160 filed Jan. 22, 1991, "Modular Implementation for a Parallelized Key Equation Solver for Linear Algebraic Codes", IBM Doc. SA9-91-003.
US Serial No. 07/917,704 filed Jul. 20, 1992, Programmable Sequential Solution of Key Equation for Linear Algebraic Codes, IBM Doc. SA9-92-019.
G. Fettweis, M. Hassner, A Combined Reed-Solomon Encoder and Syndrome Generator with Small Hardware Complexity, IEEE 0-7803-0593-0/92, pp. 1871–1874.

*Primary Examiner*—Stephen M. Baker
*Attorney, Agent, or Firm*—Henry E. Otto, Jr.

[57] ABSTRACT

A composite encoder/syndrome generating circuit computes both check symbols and error syndromes using a single set of multiplier devices with varying tap weights having values that provide a maximum preselected error correction capability but is readily adjustable, such as by programmable latches, to eliminate from the circuit selectable multiplier devices to reduce the error correction capability without requiring a change in the tap weight values. The circuit may be used to increase or decrease error correction capability (a) according to which of a plurality of concentric bands of recording tracks is being accessed in a banded direct access data storage device, (b) according to noise level as sensed in a data communications channel having an output subject to noise, or (c) according to changes in sending rates in a sending device that sends data at variable rates.

9 Claims, 4 Drawing Sheets

ADJUSTABLE ERROR-CORRECTION COMPOSITE REED-SOLOMON ENCODER/SYNDROME GENERATOR

CROSS-REFERENCE TO RELATED APPLICATIONS

[A] U.S. Ser. No. 07/644,160, filed Jan. 22, 1991, entitled "Modular Implementation for a Parallelized Key Equation Solver for Linear Algebraic Codes".

[B] U.S. Ser. No. 07/917,704, filed Jul. 20, 1992, entitled "Programmable Sequential Solution of Key Equation for Linear Algebraic Codes".

FIELD OF THE INVENTION

This invention relates to error correction systems, and more particularly to those employing a composite encoder/syndrome generator for generating both check symbols and error syndromes which is readily adjustable to provide a variety of error correction capabilities without requiring changes in hardware.

BACKGROUND OF THE INVENTION

U.S. Pat. No. 4,584,686 discloses a Reed-Solomon (RS) error correction apparatus which is programmable to perform encoding, error detection and syndrome generation, in the manner hereinafter to be described, and uses one set of multiplier devices for computing check symbols and another set for computing error syndromes.

U.S. Pat. No. 4,804,959 discloses a method of increasing storage capacity in a disk file having one or more rotatable disks partitioned into concentric recording bands by using run-length-limited RS codes with code rates that increase progressively in each successive outer band. However, a separate encoder, each with a different polynomial, is required to implement each change in correction power.

U.S. Pat. No. 5,068,858 also discloses, for use with RS codes, a method for varying the error correction capability in a disk file having at least one disk partitioned into concentric recording bands by reducing the number of redundant bytes and hence codeword length in respective concentric bands of each disk progressively in each successive band toward the innermost band. The reduced codeword length may not, however, be compatible with the format of the written data sector.

These references and other prior art known to applicants do not disclose or remotely suggest a composite or unitary encoder/syndrome generator circuit that computes both check symbols and error syndromes using a single set of multiplier devices with varying tap weights having values that provide a maximum preselected error correction capability but readily adjustable, such as by programmable latches, to eliminate from the circuit selectable multiplier devices to reduce the error correction capability without requiring a change in the tap weight values.

SUMMARY OF THE INVENTION

An algebraic error correction system for use with Reed-Solomon codes is disclosed. It comprises a composite encoder/syndrome generating circuit for generating both check symbols and error syndromes. The circuit comprises a single set of multiplier devices that have tap weights with preselected values for computing the check symbols and also computing the error syndromes used to determine error locations and values. When included in the circuit, the complete set of multiplier devices provides a maximum preselected error correction capability. The number of multiplier devices included in the circuit is adjustable, such as by adaptively or by programming, to provide a desired error correction capability less than the maximum capability without requiring changes in the values of the tap weights.

The circuit may be used to increase or decrease error correction capability (a) according to which of a plurality of concentric bands of recording tracks is being accessed in a direct access data storage device, (b) according to noise level as sensed in a data communications channel having an output subject to noise, or (c) according to changes in sending rates in a sending device that sends data at variable rates.

According to one embodiment, means conditioned by a controller selects between encoding and decoding operations and, for either of these operations, selects between either of two operating conditions for the circuit. The circuit is operative while in one condition during an encoding operation to pass data to a channel and generate the check symbols and while in the other condition during the encoding operation is operative to pass the check bytes to the channel. The circuit is operative while in said one condition during a decoding operation to pass data from the channel to a buffer and generate the error syndromes, and while in said other position during the decoding operation is operative to pass the error syndromes to a decoder.

DESCRIPTION OF THE PRIOR ART

Figure 1:
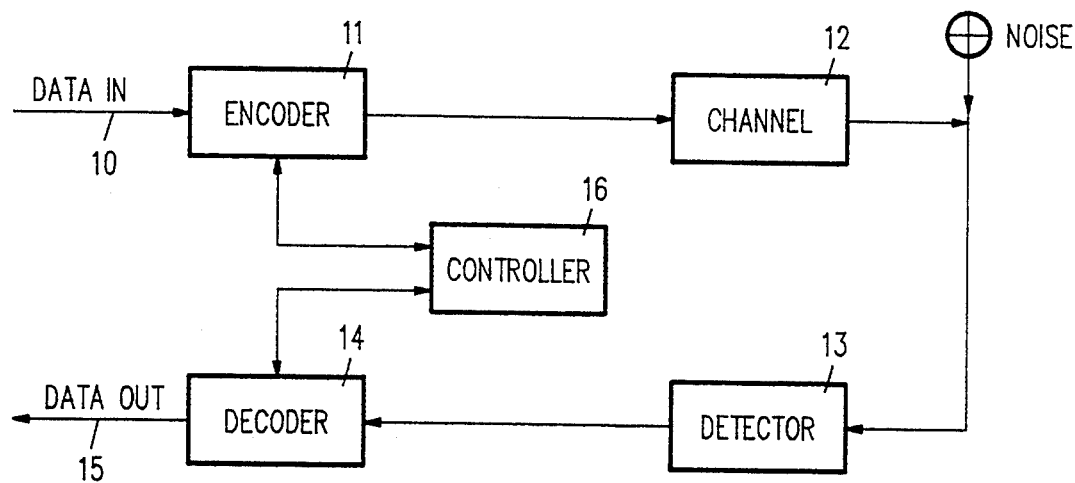
FIG. 1 is a block diagram schematically depicting a conventional prior art error correction apparatus.

As depicted in FIG. 1, input data in the form of symbol strings is transmitted from bus 10 to an encoder 11. Encoder 11 generates check symbols, such as check bytes, that are appended to the uncorrupted input data and transmitted to a channel 12 subject to noise. An output sequence generated by channel 12 is detected by a detector 13 that calculates the most probable code sequence from the channel output sequence. A decoder 14 then generates, from this most probable code sequence, error syndromes from which the decoder computes error locations and error values. These syndromes are used to correct the corrupted data from the channel and provide output data which is transmitted to data out bus 15. The encoding and decoding operations performed by the encoder 11 and decoder 14 are controlled in conventional fashion by a controller 16.

Figure 2:
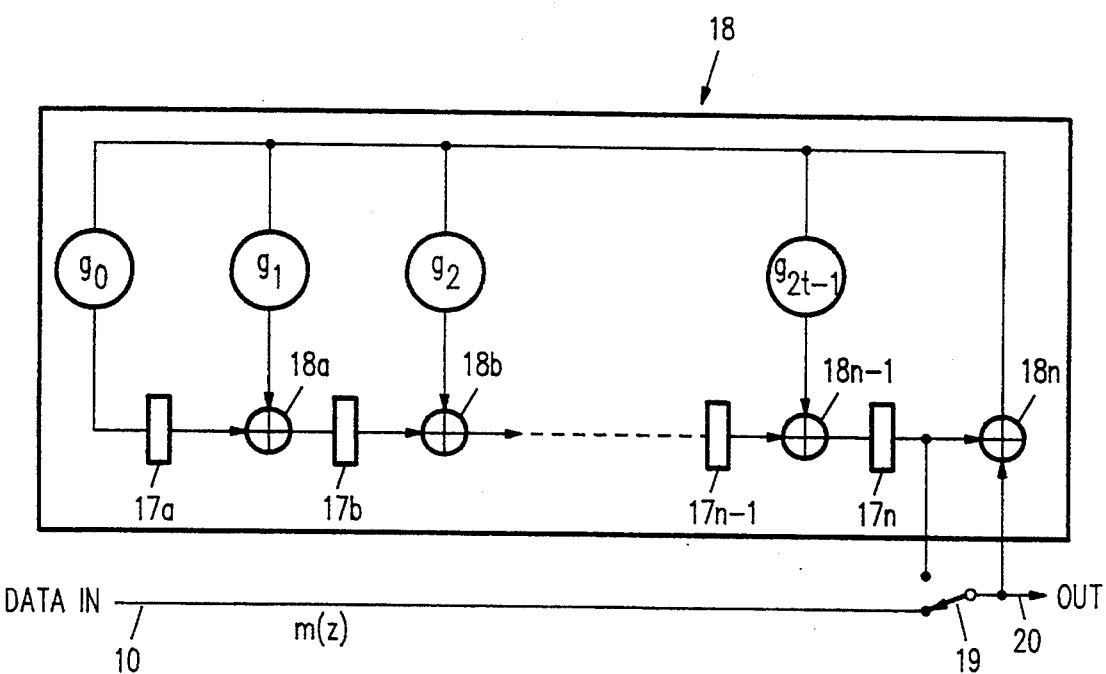
FIG. 2 depicts, in simplified form, a conventional encoder circuit shown in FIG. 1 and which is essentially similar to that shown in U.S. Pat. No. 4,584,686.

Encoder 11 may be of the prior art type illustrated in FIG. 2. It constitutes a linear feedback shift register with a plurality of multipliers $g_0, g_1, \ldots, g_{2t-1}$ constituting tap weights of differing values to generate t check symbols, where $g_i$, $i=0,\ldots,2t-1$ are the coefficients of the linear feedback shift register connection polynomial. Encoder 11 comprises a plurality of latches 17, each of which stores one check byte. For example, latch 17a provides the output of multiplier $g_0$ as an input to an associated adder 18a whose other input is the output of multiplier $g_1$. Other latches 17b, ..., 17n are interposed between successive pairs of adders 18a, 18b, ..., 18n, as shown.

When controller 16 (FIG. 1) causes switch 19 to be positioned as shown, input data m(z) is supplied via bus 10 to out bus 20 for storage in the channel and also to encoder 11. Encoder 11 adds to the input data m(z) a check polynomial $r(z) \equiv m(z)$ mod $g(z)$ and provides a transfer function $h(z)=1+1/g(z)$, where the degree of m(z) is the number of bytes in the input data and z is an indeterminate variable. When switch 19 is repositioned to its upper position by controller 16, ECC check bytes will be transmitted via bus 20 to channel 12 (FIG. 1) and appended to the previously transmitted uncorrupted data.

Note that every time a change in correction power is desired, it is necessary to recompute the encoder polynomial $$g(z) = \prod_{i=0}^{2t-1} (1 - a^i z^{-1})$$

whose coefficients are the tap weights $(g_0, \ldots, g_{2t-1})$, a being the root of a primitive irreducible polynomial that generates the Galois field used to represent data symbols, and $i=0,\ldots,2t-1$. This undesirably requires a plurality of encoders, increasing hardware cost.

Figure 3:
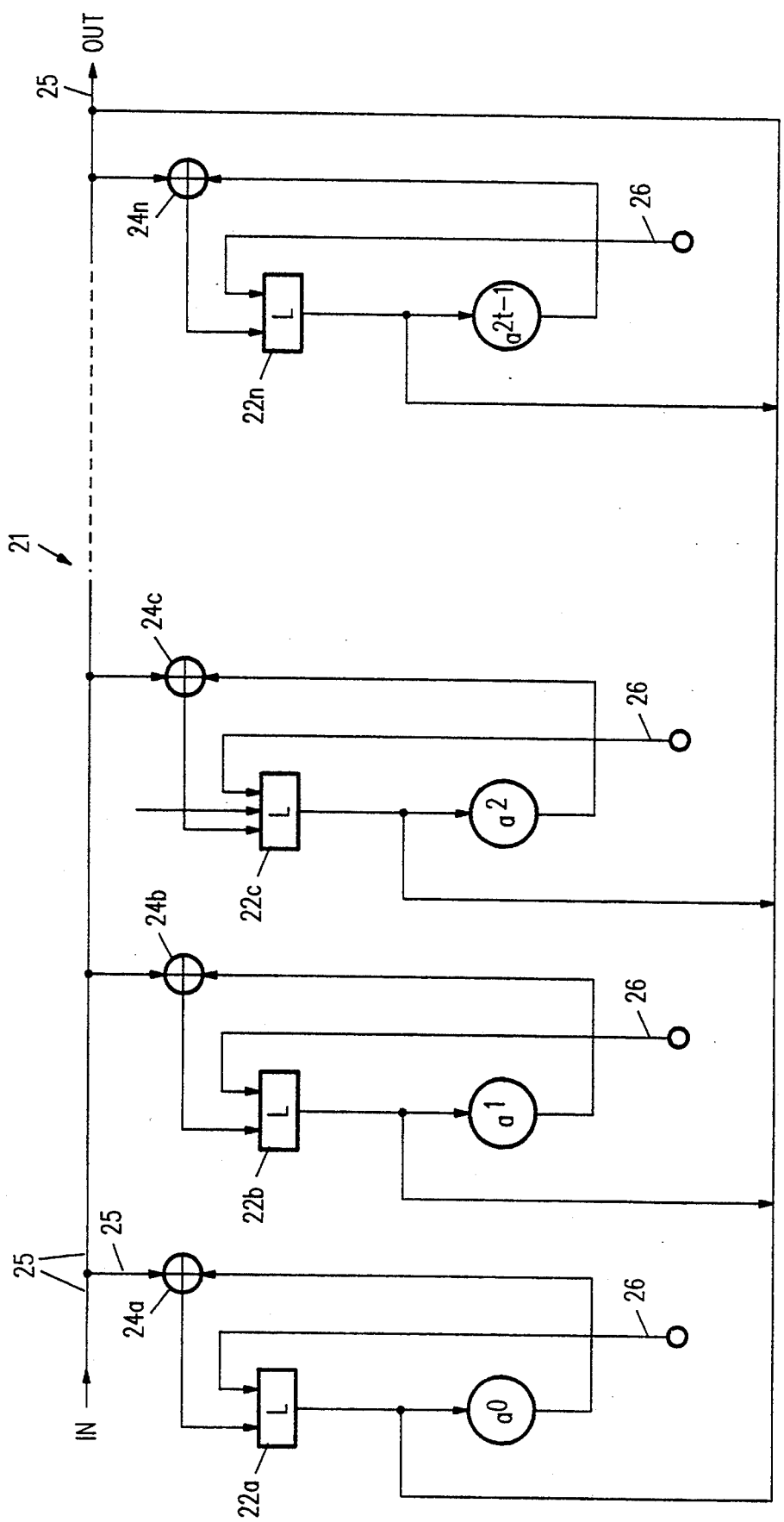
FIG. 3 depicts, in simplified form, a conventional syndrome generating circuit shown in FIG. 1 and essentially as shown in U.S. Pat. No. 4,584,686.

FIG. 3 depicts a conventional prior art syndrome generator 21 comprising a plurality of fixed multipliers $a^0, a^1, a^2, \ldots, a^{2t-1}$, latches 22a, 22b, 22c, ..., 22n, and adders 24a, 24b, 24c, ..., 24n. Controller 16 causes the encoded data to be transmitted from channel 12 via detector 13, bus 25, and a multiplexor (not shown) to a buffer (not shown) where it is stored until data transmission has been completed. Meanwhile, the data will also be transmitted via bus 25 to each adder 24 and latch 22 and a corresponding multiplier a which multiplies the input to produce an error syndrome which is fed to each respective latch 22. When data transmission has been completed, controller 16 will provide a signal to each of the latches 22 via branches of line 26 to reset the latches and cause them to output the error syndromes via bus 25, and the aforementioned multiplexor to decoder 14 (FIG. 1). These error syndromes will contain error locations and error values.

DESCRIPTION OF THE PREFERRED EMBODIMENTS

In order to adjust error correction capability when using an RS code, it is necessary that this capability be adjustable in both the encoder and decoder. The above-cited related copending applications disclose modular configurations for RS decoders that are programmable to provide variations in err,Dr correction power. However, the conventional RS encoder is not programmable to vary correction power.

Figure 4:
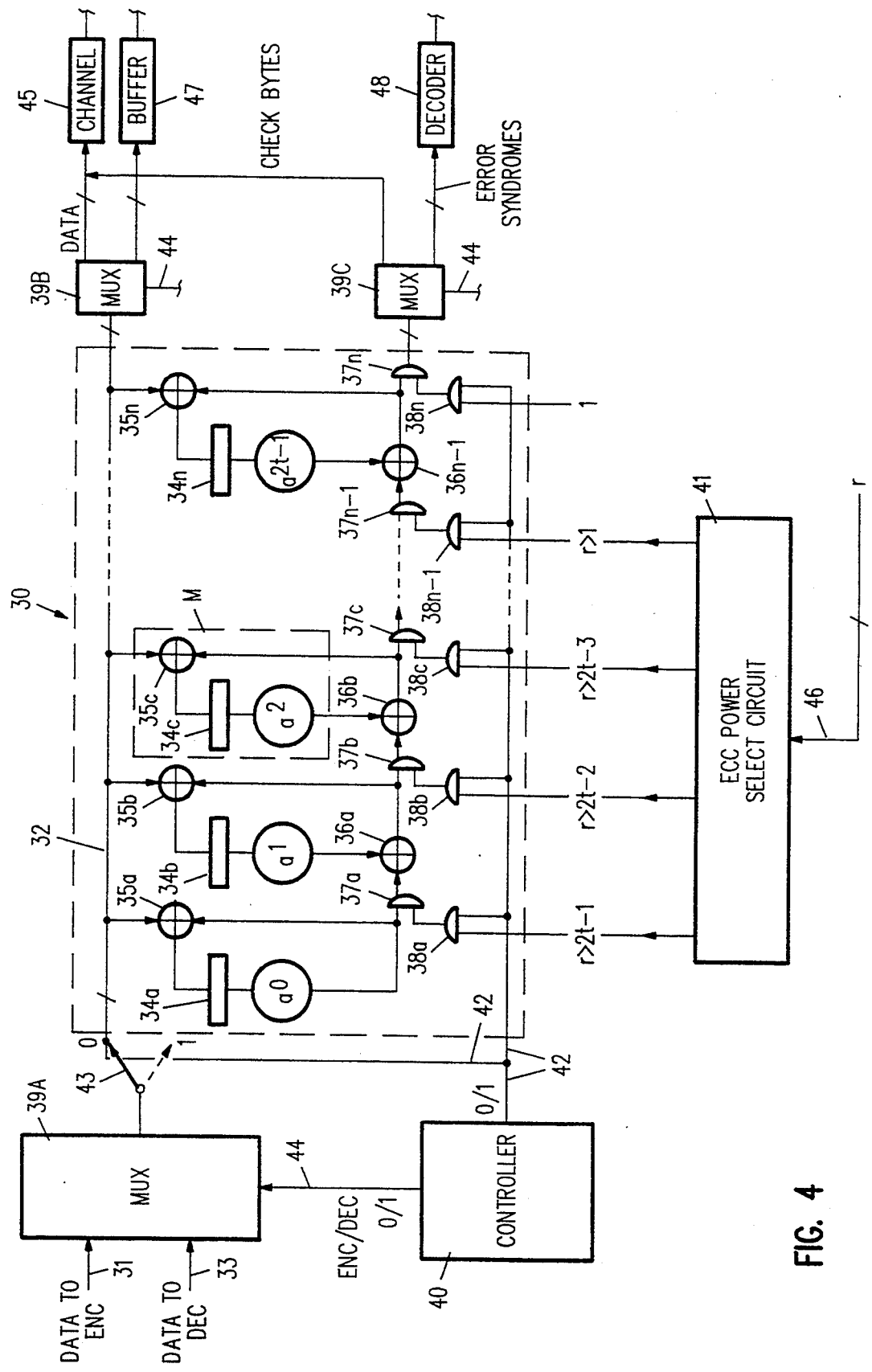
FIG. 4 depicts a composite or unitary encoder/syndrome generating circuit generically illustrating the invention.

FIG. 4 illustrates an algebraic error correction system embodying the invention comprising a composite encoder/syndrome generator circuit 30. According to the invention, circuit 30 (a) generates the check symbols that are appended to the uncorrupted input data supplied via bus 31 and transmitted via bus 32 to a channel subject to noise; and also (b) computes the error syndromes from the potentially noise-corrupted data received via bus 33 from the channel.

As illustrated, circuit 30 comprises a plurality of fixed multipliers $a^0, a^1, a^2, \ldots, a^{2t-1}$, latches 34a, 34b, 34c, ..., 34n, and one set of adders 35a, 35b, 35c, ..., 35n (which may be identical with the respective multipliers, latches, and adders described in connection with FIG. 3). Each multiplier $a^i$, latch 34, and associated adder 35 constitutes a multiplier unit M. According to the invention, circuit 30 also includes a second set of adders 36a, 36b, ..., 36n−1, a first set of AND gates 37a, 37b, 37c, ..., 37n, and a second set of AND gates 38a, 38b, 38c. ..., 38n−1, and an AND gate 38n which has one input that is constantly on (i.e., a "1").

The error correction system also includes multiplexors (MUXs) 39A, 39B, 39C, a controller 40, and a programmable ECC power selection circuit 41.

As in the prior art, to correct t symbols in error, 2t check symbols and 2t error syndromes must be generated. According to a feature of the invention, the number of check symbols that will be generated depends upon the programmed value of r preselected by the user, as this will determine the number of multiplier units M that are activated in circuit 30.

Assume now, for the sake of illustration, that r=2. All control lines to the left of 2t−2 (i.e., r>2t−2 and r>2t−1) will be deactivated; and, hence, only the rightmost units with the fixed multipliers ($a^{2t-2}$, $a^{2t-1}$) will receive incoming data, as will become more apparent from the subsequent description of operation.

In operation, to encode uncorrupted incoming data, controller 40 will provide no signal in line 42 causing switch 43 to be biased to its upper position, as shown; and no signal in line 44 to condition MUX 39A to transmit uncorrupted incoming data from bus 31 via switch 43 to bus 32. From bus 32, the data is fed to MUX 39B. MUX 39B is conditioned by the absence of a signal in line 44 to cause the data to be transmitted to or stored in channel 45. Data from bus 32 is also concurrently fed back via the respective adders 35, latches 34, and multipliers $a^i$ of the respective multiplier units M for computing check symbols, the values of which are stored in the respective latches.

When transmission of data via bus 32 to channel 45 is completed, a signal will be applied to line 42, causing switch 43 to be pulled to its lower position in which it is disconnected from bus 32. Meanwhile, the programmable ECC power selection circuit 41 will have been conditioned by the value (from 0 to 2t−1) preselected for r in line 46 to provide corresponding outputs in corresponding control lines labeled r>1 ... r>2t−1. The signal in line 42 will be put to all AND gates 38a through 38n. If as earlier assumed r=2, only the two rightmost AND gates $38_{n-1}$ and 38n will be activated to feed the check bytes stored in the latches $34_{n-1}$ through 34n of the respective multiplier units M sequentially starting from the rightmost unit under control of a clock (not shown) and as permitted by AND gate 38n. MUX 39C is conditioned by the signal in line 44 to cause these check bytes to be transmitted to channel 45 and appended to the uncorrupted input data previously transmitted via switch 43 in upper position. Note that AND 38n is necessary to isolate latch 34n from the MUX 39C unless line 42 is on.

For decoding, MUXs 39A and 39B are conditioned by the absence of a signal in line 44 from controller 40 to pass the data to be decoded from bus 33 via switch 43 in upper position (there being no signal in line 42) and then via bus 32 to buffer 47. Also, as during encoding, the data will be fed to the various multiplier units M to generate error syndromes which are stored in the respective latches 34a . . . 34n.

After the data to be decoded has been transmitted to buffer 47, controller 40 will activate line 42 to cause the error syndromes stored in the latches 34c . . . 38n to be shifted out through MUX 39C to decoder 48. With selection circuit 41 conditioned by the selected value of r to deactivate all control lines to the left of 2t−2, as previously assumed, only the multiplier units M to the right of r>2t−2 will be activated.

It will thus be seen that the value selected by the user for the variable r will determine the number of check bytes and error syndromes that are generated, and hence the preselected degree of correction power desired from a maximum corresponding to 2t−1 to a minimum of 0.

Figure 5:
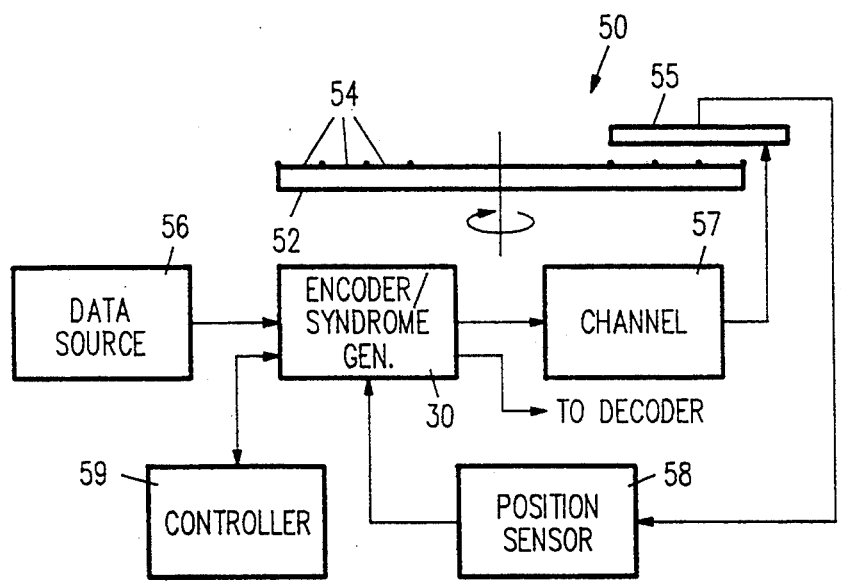
FIG. 5 depicts how the invention may be implemented in a direct access storage device having banded (i.e., zoned) recording disks.

FIG. 5 depicts a direct access data storage device 50 comprising a rotatable disk 52 having data stored on recording tracks in concentric bands 54 that is accessible by an actuator 55 that may be movable arcuately or radially of the disk. Data to be recorded is supplied from a data source 56 via encoder/syndrome generator circuit 30 under control of controller 41 (FIG. 4) to a recording channel 57 having an output connected to the actuator 55. A feedback circuit is provided from the actuator to a sensor 58 which senses the particular band being accessed by the actuator. Sensor 58 provides an output to the ECC control line of encoder/generator circuit 30 to condition the latter to increase the error correction capability as the bands 54 being accessed are closer to the axis of rotation because the data is more closely spaced at the inner bands, increasing the probability of error.

Figure 6:
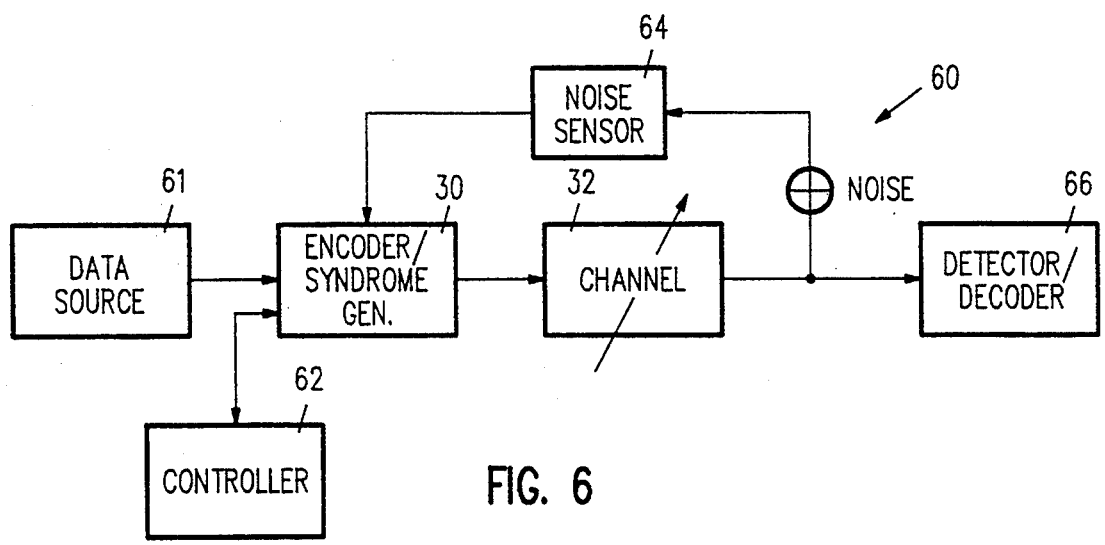
FIG. 6 depicts how the invention may be implemented in a data communications system.

FIG. 6 illustrates a data communications system 60 embodying the invention. Data from data source 61 is encoded under control of controller 62 by encoder/syndrome generator circuit 30 and transmitted to a channel 62 subject to noise. This noise is sensed by a sensor 64 (comparable to selection circuit 41 of FIG. 4) which provides an output to the ECC control lines of encoder/generator circuit 30 to condition the latter to increase the error correction capability in steps as noise increases between preselected ranges and error probability correspondingly increases, and vice versa. This enhances the error detection capability of the detector/decoder 66.

Figure 7:
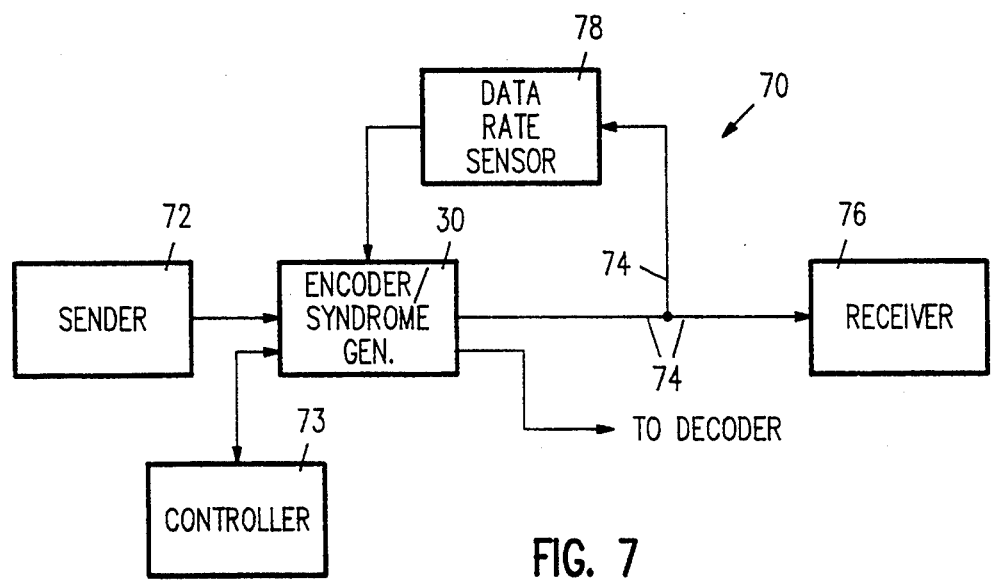
FIG. 7 depicts how the invention may be implemented in a data network environment.

FIG. 7 depicts a data network 70 comprising a sender 72 for transmitting data under control of a controller 73 via encoder/syndrome generator circuit 30 and a variable data rate line or bus 74 to a receiver 76. A sensor 78 senses the data rate and provides an output to the ECC control lines of encoder/generator circuit 30 to condition the latter to increase the error correction capability when data rate and thus probability of error increases, and vice versa.

It will be understood that various changes may be made in the error correction apparatus and method herein described. The embodiments illustrated are therefore to be considered merely as illustrative and the invention is not to be considered limited except as specified in the claims.

We claim:

1. An algebraic error correction system, comprising:
 a composite encoder/syndrome generating circuit for generating both check symbols and error syndromes, said circuit comprising a single set of multiplier devices that have tap weights with preselected values for computing the check symbols and also computing the error syndromes used to determine error locations and values, the complete set of multiplier devices providing a maximum preselected error correction capability; and
 means for selectively adjusting the number of said multiplier devices from the set included in said circuit to provide a desired error correction capability less than said maximum capability without requiring changes in the values of the tap weights.

2. The system of claim 1, including:
 a direct access storage device having at least one disk with data stored on recording tracks in concentric bands;
 an actuator for accessing data on selectable tracks within selected ones of said bands; and
 a sensor for sensing the location of the band being accessed, said sensor being interposed in a feedback circuit between the actuator and encoder/syndrome generating circuit and operative to condition said adjusting means to selectively adjust the error correction capability according to the particular band being accessed by the actuator.

3. The system of claim 1, including a data source, a communications channel with an output subject to noise, and a noise level sensor in a feedback circuit between the channel output and encoder/syndrome generating circuit for conditioning said adjusting means to increase or decrease the error correction capability according to whether the noise level as sensed by said sensor increases or decreases, respectively.

4. The system of claim 1, including a data network comprising a data receiver having an input, a data sender for sending data at variable sending rates via the encoder/syndrome generating circuit to the data receiver, and a sensor interposed in a feedback circuit between the input to the receiver and the encoder/syndrome generating circuit and responsive to changes in sending rates to condition said adjusting means to increase or decrease the error correction capability according to whether the sending rate increases or decreases, respectively.

5. A method of adjusting error correction capability in at least one system from a group of systems including a direct access storage system, data communications system, or data network system, including the steps of:
 providing in a circuit a single set of multiplier devices with tap weights having values preselected for computing values for both check symbols and for error syndromes necessary to determine error locations and values for providing a maximum preselected error correction capability; and
 selectively adjusting the number of said multiplier devices included in the circuit to provide a desired error correction capability less than said maximum capability without requiring changes in the values of the tap weights.

6. A data processing system comprising:

a controller;
a channel;
a buffer;
a decoder;
a circuit comprising means operative during an encoding operation to generate check symbols and during a decoding operation to generate error syndromes, said circuit comprising;
  (i) multiplier devices that have tap weights with preselected values for computing the check symbols and also computing the error syndromes for providing a maximum preselected error correction capability when all of said multiplier devices are included in the circuit; and
  (ii) means for selectively adjusting the number of said multiplier devices included in said circuit to provide a desired error correction capability less than said maximum capability without requiring changes in the values of the tap weights; and
means (39A, 39B, 39C, 42, 43, 44) conditioned by said controller to select between encoding and decoding operations and, for either of these operations, between either of two operating conditions for said circuit, said circuit being operative while in one condition during an encoding operation to pass data to the channel and generate the check symbols and while in the other condition during the encoding operation to pass the check bytes to the channel, said circuit being operative while in said one condition during a decoding operation to pass data from the channel to the buffer and generate the error syndromes, and while in said other position during the decoding operation to pass the error syndromes to the decoder.

7. The system of claim 6, including programmable means (41) for adjusting the number of multiplier devices included in the circuit.

8. The system of claim 6, including means (41) for adaptively adjusting the number of multiplier devices included in the circuit.

9. The system of claim 6, wherein the circuit is used for encoding and decoding operations utilizing Reed-Solomon error correcting codes.

* * * * *